(12) United States Patent
Sherpa et al.

(10) Patent No.: US 11,658,037 B2
(45) Date of Patent: *May 23, 2023

(54) METHOD OF ATOMIC LAYER ETCHING OF OXIDE

(71) Applicant: Tokyo Electron Limited, Tokyo (JP)

(72) Inventors: Sonam D. Sherpa, Albany, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/930,708

(22) Filed: May 13, 2020

(65) Prior Publication Data

US 2020/0273713 A1 Aug. 27, 2020

Related U.S. Application Data

(63) Continuation of application No. 16/401,441, filed on May 2, 2019, now Pat. No. 10,770,305.

(60) Provisional application No. 62/684,878, filed on Jun. 14, 2018.

(51) Int. Cl.
*H01L 21/311* (2006.01)
*H01J 37/32* (2006.01)

(52) U.S. Cl.
CPC .. *H01L 21/31116* (2013.01); *H01J 37/32009* (2013.01); *H01J 2237/3174* (2013.01)

(58) Field of Classification Search
None
See application file for complete search history.

(56) References Cited

U.S. PATENT DOCUMENTS

| | | | | |
|---|---|---|---|---|
| 9,779,956 | B1* | 10/2017 | Zhang | H01L 21/31116 |
| 10,770,305 | B2* | 9/2020 | Sherpa | H01L 21/31116 |
| 2010/0018944 | A1* | 1/2010 | Lai | H01L 21/31116 216/13 |
| 2010/0041207 | A1* | 2/2010 | Lee | H01L 21/02274 257/E21.546 |
| 2013/0143372 | A1* | 6/2013 | Kim | H01L 21/3086 438/163 |
| 2015/0187580 | A1* | 7/2015 | Chen | H01L 21/31116 438/695 |
| 2015/0255569 | A1* | 9/2015 | Kim | H01L 29/66545 438/261 |
| 2016/0049310 | A1* | 2/2016 | Kunnen | H01L 21/76897 423/292 |
| 2017/0345673 | A1* | 11/2017 | Ranjan | H01L 21/76897 |

* cited by examiner

*Primary Examiner* — Roberts P Culbert

(57) ABSTRACT

In one exemplary embodiment, described herein is an ALE process for etching an oxide. In one embodiment, the oxide is silicon oxide. The ALE modification step includes the use of a carbon tetrafluoride (CF4) based plasma. This modification step preferentially removes oxygen from the surface of the silicon oxide, providing a silicon rich surface. The ALE removal step includes the use of a hydrogen (H2) based plasma. This removal step removes the silicon enriched monolayer formed in the modification step. The silicon oxide etch ALE process utilizing CF4 and H2 steps may be utilized in a wide range of substrate process steps. For example, the ALE process may be utilized for, but is not limited to, self-aligned contact etch steps, silicon fin reveal steps, oxide mandrel pull steps, oxide spacer trim, and oxide liner etch.

9 Claims, 9 Drawing Sheets

METHOD OF ATOMIC LAYER ETCHING OF OXIDE

This application is a continuation of U.S. patent application Ser. No. 16/401,441, entitled "Method of Atomic Layer Etching of Oxide," filed May 2, 2019, which claims priority to U.S. Provisional Patent Application No. 62/670,459, entitled, "Method of Atomic Layer Etching of Oxide," filed May 11, 2018 and U.S. Provisional Patent Application No. 62/684,878, entitled, "Method of Atomic Layer Etching of Oxide," filed Jun. 14, 2018 the disclosure of which is expressly incorporated herein, in its entirety, by reference.

BACKGROUND

The present disclosure relates to the processing of substrates in plasma process equipment. In particular, it provides a method to control plasma etching of layers comprising oxides.

The use of plasma systems for the processing of substrates has long been known. For example, plasma processing of semiconductor wafers is well known. One well known use of plasma processing is for etching of substrates. Plasma etching presents numerous technical challenges. Further as geometries for structures and layers on substrates continue to shrink, tradeoffs between etch selectivity, profile, aspect ratio dependent etching, uniformity, etc. become more difficult to manage. In order to achieve desired process performance, variable settings of the plasma processing equipment can be adjusted to change the plasma properties. These settings include, but are not limited to gas flow rates, gas pressure, electrical power for the plasma excitation, bias voltages, etc., all as is known in the art. However, as geometries continue to shrink it has been found that sufficient control of ion energy, ion flux, radical flux, etc. that results from the settings of the plasma processing equipment is not satisfactory to achieve the desired etch results.

One technique to improve plasma etching has been to utilize atomic layer etch (ALE) plasma processes. ALE processes are general known to involve processes which remove thin layers sequentially through one or more self-limiting reactions. Thus, ALE processes offer improved performance by decoupling the etch process into sequential steps of surface modification and removal of the modified surface, thereby allowing the segregation of the roles of radical flux and ion flux and energy. Such processes often include multiple cyclic series of layer modification and etch steps. The modification step may modify the exposed surfaces and the etch step may selectively remove the modified layer. Thus, a series of self-limiting reactions may occur. As used herein, an ALE process may also include quasi-ALE processes. In such processes, a series of modification and etch step cycles may still be used, however, the removal step may not be purely self-limiting as after removal of the modified layer, the etch substantially slows down, though it may not completely stop. In either case, the ALE based processes include a cyclic series of modification and etch steps.

It would be desirable to provide an improved ALE process. More specifically, it would be desirable to provide an improved ALE process for etching of oxides.

SUMMARY

In one exemplary embodiment, described herein is an ALE process for etching oxides. In one embodiment, an ALE process for etching silicon oxide is provided. However, it will be recognized that the concepts described herein may be applicable to the etching of other oxides, for example, metal oxides, germanium dioxide, silicon oxynitride, etc. In an embodiment, an ALE modification step includes the use of a fluorinated hydrocarbon such as a carbon tetrafluoride ($CF_4$) based plasma, wherein the fluorinated hydrocarbon can be perfluorinated hydrocarbon and is gaseous at the working temperatures of the methods described herein. This modification step preferentially removes oxygen from the surface of the silicon oxide, providing a modified surface layer, which can be a silicon rich surface and can be a monolayer. The ALE removal step includes the use of a hydrogen ($H_2$) based plasma. This removal step removes the silicon enriched layer formed in the modification step. The silicon oxide etch ALE process utilizing $CF_4$ and $H_2$ steps may be utilized in a wide range of substrate process steps. For example, the ALE process may be utilized for, but is not limited to, self-aligned contact etch steps, silicon fin reveal steps, oxide mandrel pull steps, oxide spacer trim, and oxide liner etch.

In one embodiment, a method for etching a substrate is provided. The method may comprise providing a first layer comprising silicon oxide, the first layer to be etched selective to a second layer. The method further comprises exposing the first layer to a first plasma comprising $CF_4$ to modify at least a surface of the first layer to form a modified surface layer, the modified surface layer being silicon rich compared to the remainder of the first layer. The method further comprises exposing the modified surface layer to a second plasma comprising $H_2$, the plasma comprising $H_2$ removing at least a portion of the modified surface layer. A combination of use of the first plasma and the second plasma reduces at least a portion of a thickness of the first layer.

In another embodiment, a method for etching a substrate is provided. The method comprises providing a first layer comprising silicon oxide. The method further comprises performing an atomic layer etch process to etch the first layer, the atomic layer etch process comprising multiple cycles of (1) a surface modification step comprising a first plasma, the first plasma comprising $CF_4$ and (2) a removal step following the surface modification step, the removal step comprising a second plasma, the second plasma comprising $H_2$.

In another embodiment, a method for reducing a thickness of a silicon oxide layer on a substrate is provided. The method comprises at least one cycle of (a) exposing the silicon oxide layer to a perfluorinated hydrocarbon plasma to modify the surface of the silicon oxide layer followed by (b) exposing a product of step (a) to an elemental hydrogen plasma to remove at least a portion of the surface modified in step (a).

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

In one exemplary embodiment, described herein is an ALE process for etching oxide. In one embodiment, an ALE process for etching silicon oxide is provided. However, it will be recognized that the concepts described herein may be applicable to the etching of other oxides. For example, metal oxides where formation of volatile metal hydride and silicon oxynitride may be applicable. The ALE modification step includes the use of a fluorinated hydrocarbon plasma such as a carbon tetrafluoride (CF4) based plasma. However, it will be recognized with the benefit of this disclosure that other fluorocarbon gases may be utilized singularly or in combination with CF4 to achieve the modification step. For example, other fluorocarbons may include, but are not limited to, hexafluorobutadiene (C4F6) and octafluorocyclobutane (C4F8). This modification step preferentially removes oxygen from the surface of the silicon oxide, providing a silicon rich layer on the surface of the substrate. The ALE removal step includes the use of a hydrogen (H2) based plasma. This removal step removes the silicon enriched layer formed in the modification step. The silicon enriched layer can be a monolayer. The silicon oxide etch ALE process utilizing CF4 and H2 steps may be utilized in a wide range of substrate process steps. For example, the ALE process may be utilized for, but is not limited to, self-aligned contact etch steps, silicon fin reveal steps, oxide mandrel pull steps, oxide spacer trim steps, and oxide liner etch steps.

Figure 1:
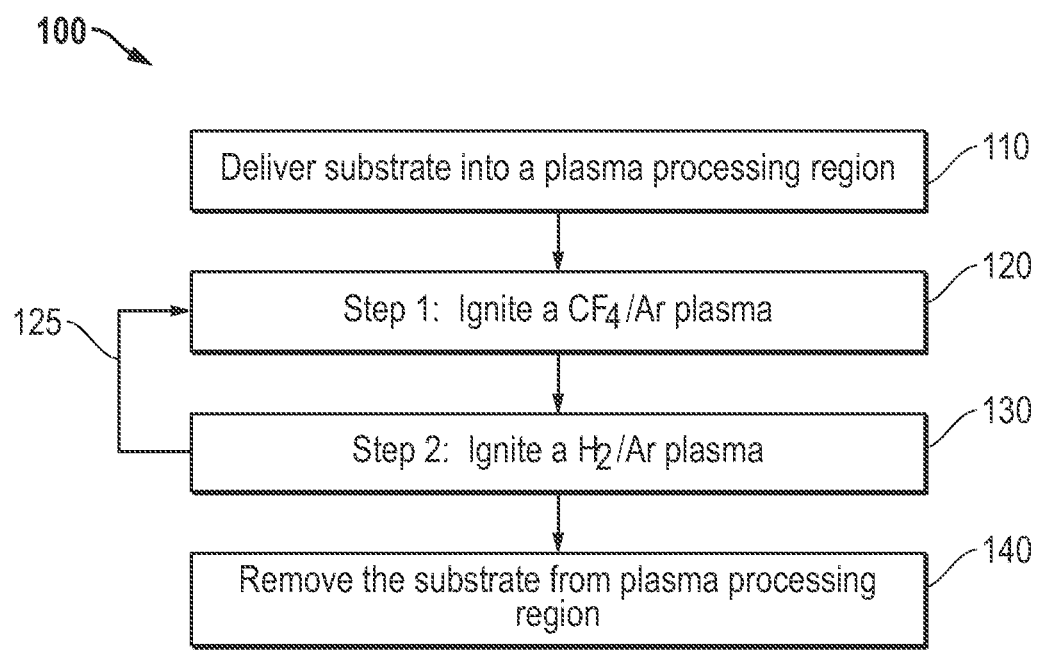
FIG. 1 illustrates one exemplary process flow utilizing the etch methods described herein.

More specifically, FIG. 1 illustrates an exemplary ALE process for etching oxide according to the techniques disclosed herein. In FIG. 1, the process 100 is illustrated by the initial delivery 110 of a substrate into a plasma processing region. Next a carbon tetrafluoride plasma is ignited in step 1, block 120. The substrate is then subjected to step 2, block 130 where a hydrogen plasma is ignited and the substrate exposed to the hydrogen plasma. It should be noted that argon or other inert gas can be used as a co-feed with the carbon tetrafluoride and hydrogen. If additional etching is desired, the substrate is returned to step 1 block 120 via line 125 for an additional cycle of steps 1 and 2. If etching is complete, the substrate is removed from the plasma processing region as shown in removal block 140.

More specifically, as shown in FIG. 1, the ALE process starts with a CF4/Argon plasma step 1 block 120 to operate as a layer modification step. Then a H2/Argon plasma step is performed as shown in step 2 block 130 to remove the modified layer generated in the layer modification step. The modification and removal steps may then be repeated a sufficient number of cycles so as to complete the removal of the desired amount of oxide. In one embodiment, the oxide is silicon oxide.

Figure 2A:
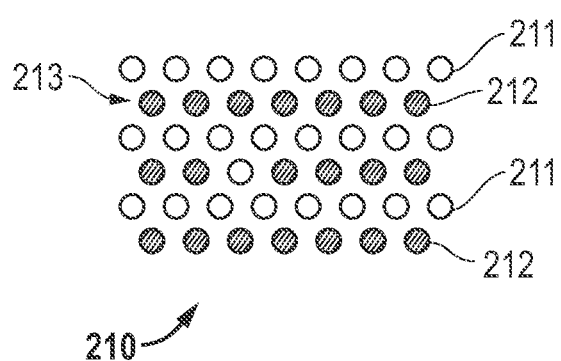
FIGS. 2A-2C illustrate the surface mechanisms which may occur in the steps of the methods of one embodiment described herein.
Figure 2B:
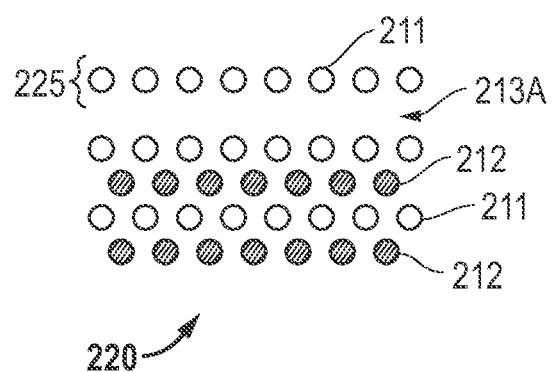
Figure 2C:
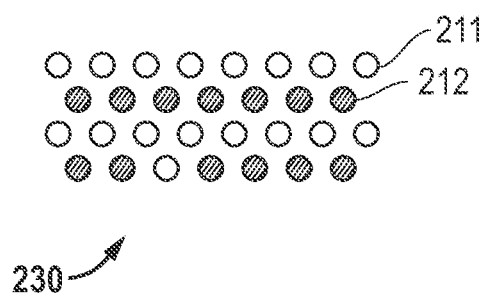

FIGS. 2A-2C illustrate the exemplary mechanisms that occur in each step of the ALE process of FIG. 1. It will be recognized that the mechanisms disclosed are merely exemplary, and other mechanisms may occur. FIGS. 2A-2C are illustrative and not intended to show precise substrate modifications. As shown in FIG. 2A, substrate 210 includes silicon atoms 211 and oxygen atoms 212. As shown in FIG. 2A an upper oxygen layer 213 is provided. After being exposed to a carbon tetrafluoride plasma, the substrate 210 is modified to form a silicon-enriched layer 225 on the substrate 220, which includes a oxygen depleted zone 213A, as shown in FIG. 2B. Notably, the upper oxygen layer 213 of FIG. 2A has been at least partially reduced resulting in a silicon-enriched layer 225. The silicon-enriched layer 225 of substrate 220 is then subjected to a hydrogen plasma, resulting in a final substrate 230 as shown in FIG. 2C. As shown in FIG. 2C, the removal of a silicon-enriched layer 225 is selective to silicon oxide.

Thus, as shown in FIGS. 2A-2C, regions at the surface of the silicon oxide become silicon rich as oxygen is removed from the silicon oxide surface in the modification step 215. Then, in the removal step (step 2), shown in FIG. 2C exposure to hydrogen plasma results in the silicon being removed due to the etching action of the hydrogen plasma, which can be a in one exemplary embodiment, a H2/Argon plasma. This process may be repeated in multiple cycles to incrementally remove oxygen and then remove the silicon rich layer down through the silicon oxide layer until the preferred amount of silicon oxide removal is achieved.

Figure 3:
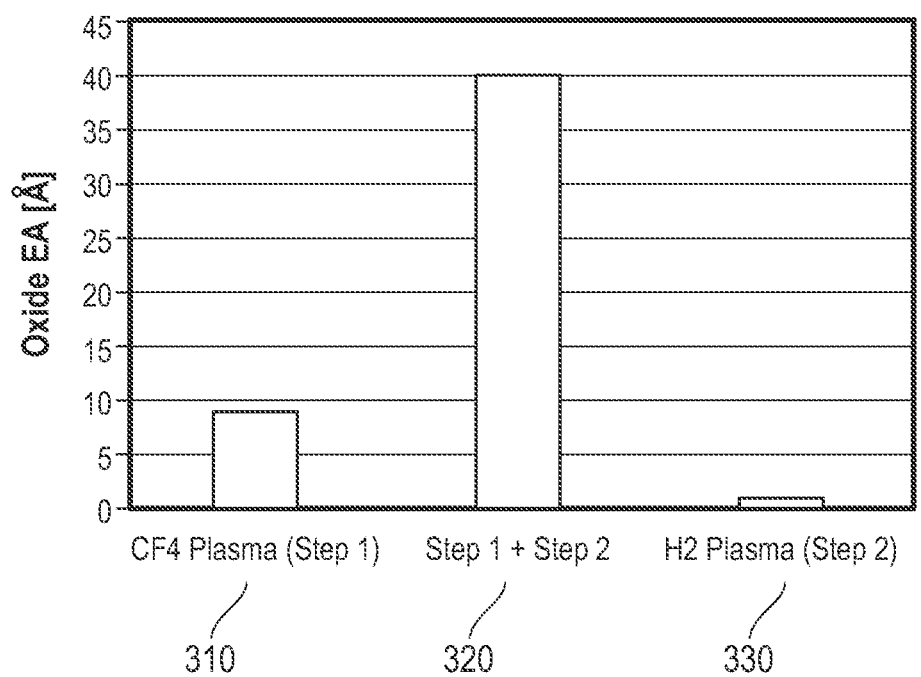
FIG. 3 illustrates one exemplary table contrasting the amount of silicon oxide etched by carbon tetrafluoride plasma alone, hydrogen plasma alone, and carbon tetrafluoride plasma followed by hydrogen plasma.

The impact of using a two-step ALE process versus merely using one or the other steps is shown in FIG. 3. As shown in the graph of FIG. 3, the amount of oxide etched by just step 1 and step 2 alone, as depicted by step 1, bar 310 and step 2, bar 330 is contrasted to the use of both steps 1 and 2 in combination as described above, as depicted in steps 1 and 2 combination, bar 320. The Y axis is denoted as oxide etched (Angstroms).

Figure 4:
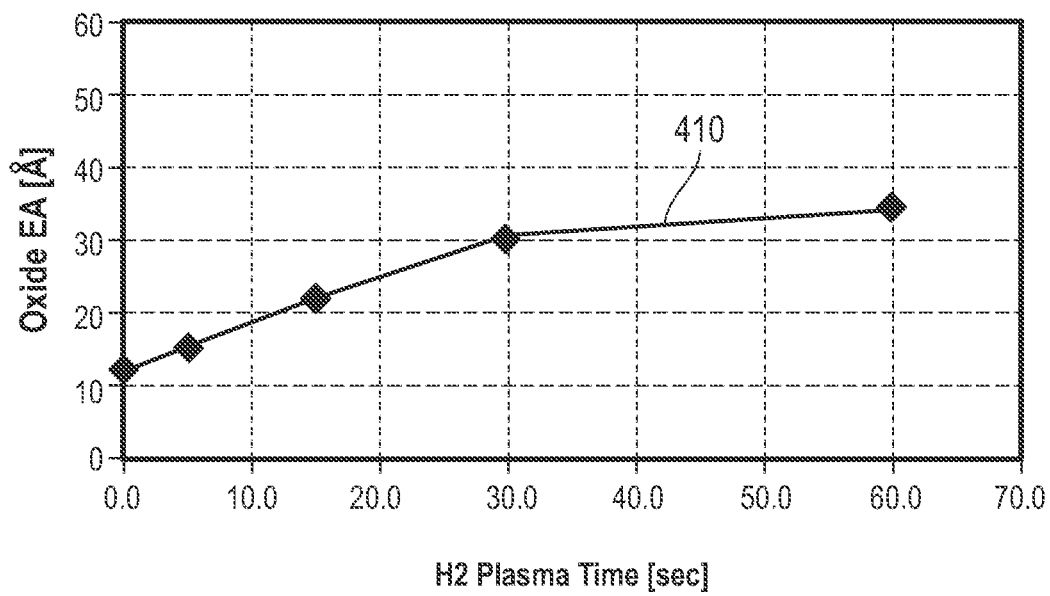
FIG. 4 illustrates a graph of silicon oxide removed by the hydrogen plasma after the carbon tetrafluoride plasma.

The self-limiting effect of the two-step ALE process is shown in FIG. 4. FIG. 4 illustrates the amount of oxide that is removed by the second step (hydrogen plasma) after performance of the first step (carbon tetrafluoride plasma). As shown in the line 410 of the graph of FIG. 4, for increasing etch times of the second step, the amount of silicon oxide removed from the surface relatively saturates over time. In the graph, the Y axis is denoted as oxide EA (Angstroms) with the X axis shown as hydrogen plasma time in seconds.

Figure 5:
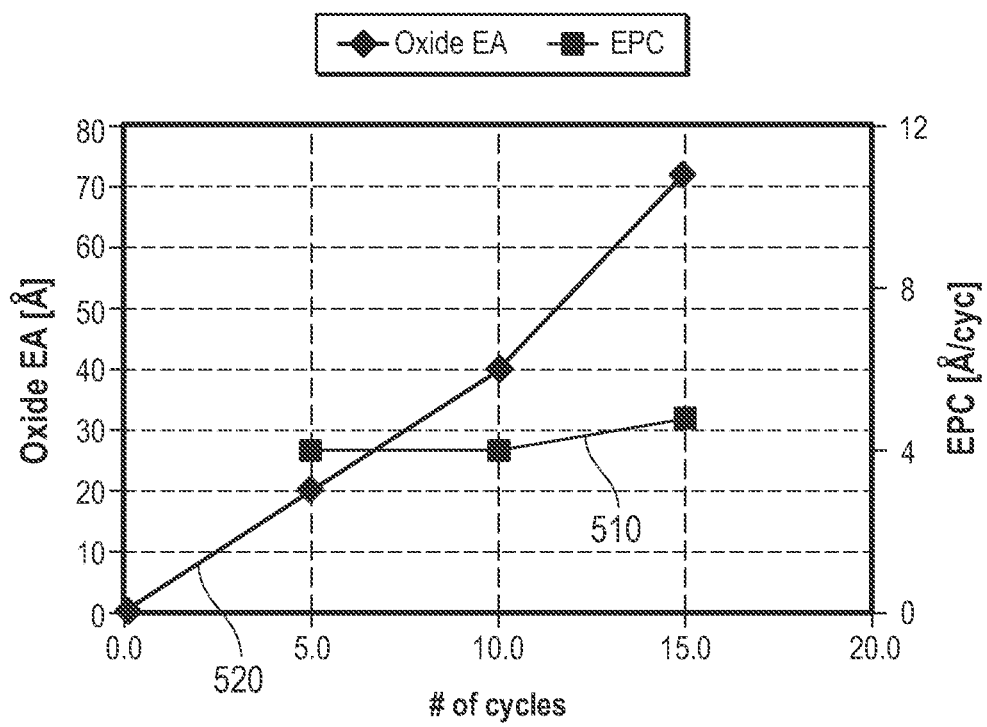
FIG. 5 illustrates a graph comparing the total silicon oxide etched and the amount of silicon oxide etched per cycle as a function of the number of first and second plasma cycles described herein.

FIG. 5 illustrates the total oxide etched and the amount of oxide etched per cycle as a function of the number of cycles of the ALE steps. The graph in FIG. 5 depicts oxide etched (Angstroms) in the left Y axis and etch per cycle (Angstroms per cycle) in the right Y axis. The X axis shows the number of cycles of steps 1 and 2. The oxide etched is denoted as line 520 and the etch per cycle is denoted as line 510.

Figure 6:
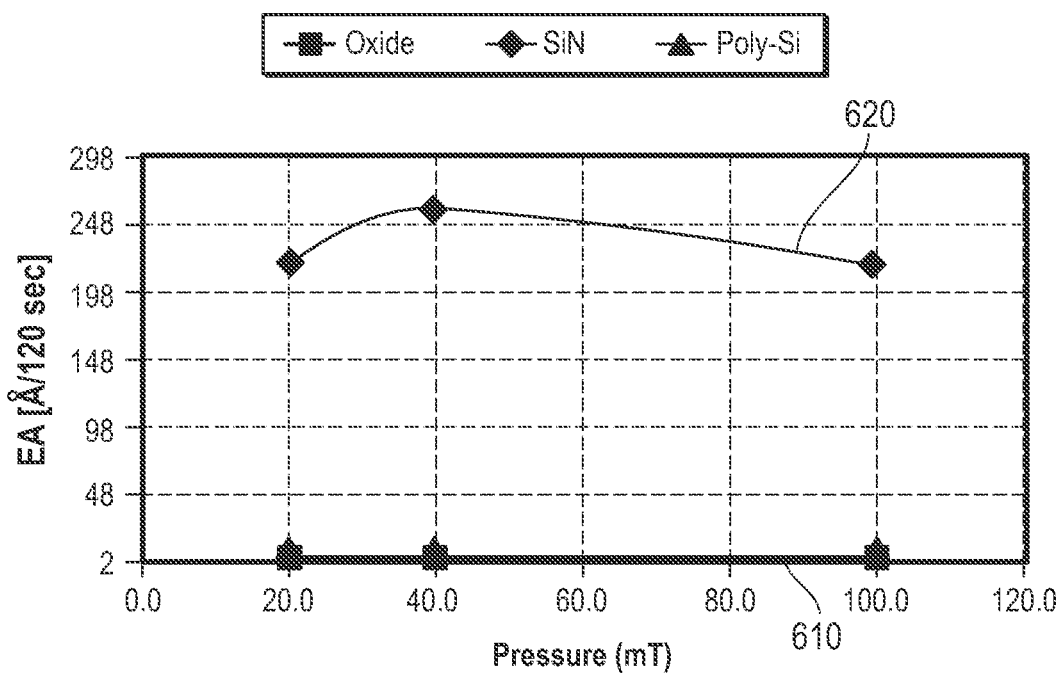
FIG. 6 illustrates a graph showing exemplary amounts of silicon oxide, silicon nitride, and polysilicon using the methods described herein.

FIG. 6 illustrates exemplary amounts of silicon oxide, silicon nitride and polysilicon for an ALE process as described herein per 120 seconds of the second step (H2/Argon plasma) as a function of the pressure of the second step. As can be seen in the graph in FIG. 6, the two-step ALE process may provide a highly selective process for etching silicon oxide or silicon nitride or polysilicon. It will be recognized that the etch amounts, etch rates, materials, and so on of FIGS. 2-6 are merely exemplary and that the concepts described herein may be used with other ALE processes having other characteristics and qualities. In the graph of FIG. 6, line 610 denotes the amount of both oxide and silicon nitride etched (as the graph lines for each material substantially overlap) and line 620 denotes the polysilicon etched.

The two-step ALE process described herein may be utilized in a wide variety of applications at various points of differing substrate process flows. For example, the ALE process may be used at self-aligned contact etch steps, silicon fin reveal steps, oxide mandrel pull steps, oxide spacer trim steps, and oxide liner etch steps. FIGS. 7A-11B provide exemplary uses of the ALE process described herein in a variety of substrate process flows. It will be recognized that the ALE process described herein may be utilized in many other substrate processing applications. For example, a variety of process steps in which selective removal of silicon oxide may be desired may suitably utilize the techniques disclosed herein. In one embodiment, the techniques may be utilized in semiconductor substrate processing, and more particular, semiconductor wafer processing.

Figure 7C:
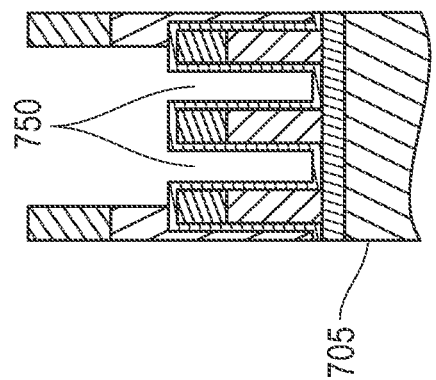
FIGS. 7A-7C illustrate a representative application of the method described herein in a self-aligned contact application.
Figure 7B:
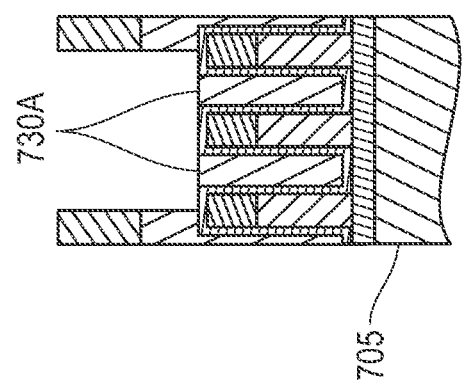
Figure 7A:
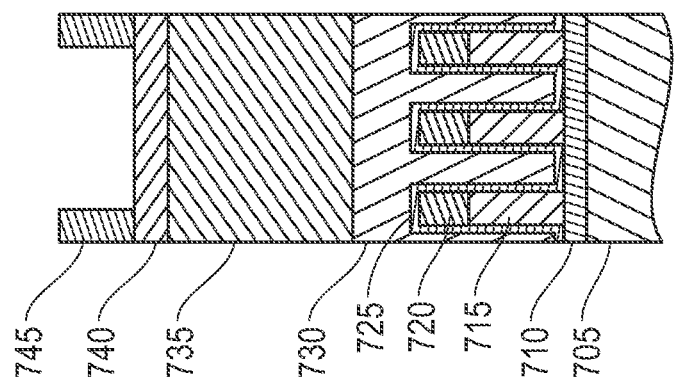

FIGS. 7A-7C illustrate an application of the ALE process techniques disclosed herein in a self-aligned contact application. As shown in FIG. 7A, a plurality of layers are formed on a substrate 705. Substrate 705 may be any substrate for which the use of patterned features is desirable. For example, in one embodiment, substrate 705 may be a semiconductor substrate having one or more semiconductor processing layers formed thereon. In one embodiment, the substrate 705 may be a substrate that has been subject to multiple semiconductor processing steps which yield a wide variety of structures and layers, all of which are known in the substrate processing art and may be considered to be part of the substrate 705. In the exemplary embodiment of FIG. 7A, an oxide layer 710, may be provided under an amorphous silicon layer 715. A silicon nitride hard mask 720 may be provided along with a silicon nitride spacer 725 as shown. An oxide layer 730 may be formed over and between the structures formed by the amorphous silicon layer 715 as shown. An organic dielectric layer 735 may be provided over which a silicon anti-reflective coating 735 is provided. A patterned photoresist layer 745 is also provided.

As shown in FIG. 7A, the oxide layer 730 is formed in and over a region where contacts may ultimately be desired to be formed. FIG. 7B illustrates removal of the various layers (which may be performed via conventional process steps) to a point where the oxide layer 730 is partially etched. In one example, a traditional oxide fluorocarbon etch may be utilized to partially etch oxide layer 730 to achieve the structure shown in FIG. 7B having a remaining portion 730A of the oxide layer 730. Then the remaining portion 730A may be removed such as shown in FIG. 7C. As shown in FIG. 7C, the remaining portion 730A has been removed by utilizing the highly selective two step ALE process described herein, for example a fluorocarbon plasma etch chemistry such as carbon tetrafluoride followed by a second step such as a hydrogen plasma step. Thus, a process is provided to remove the remainder of the oxide in the contact region in a highly selective manner to the underlying silicon nitride spacer layer to achieve. Thus, post etch a structure having contact regions 750 may be obtained.

Figure 8A:
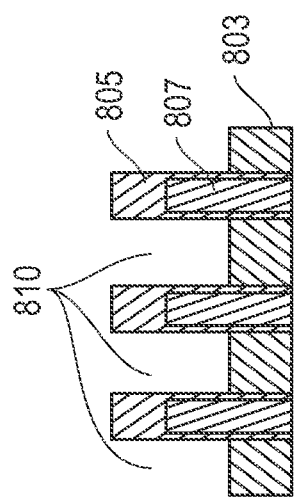
FIGS. 8A-8B illustrate a representative application of the method herein in a fin reveal application.
Figure 8B:
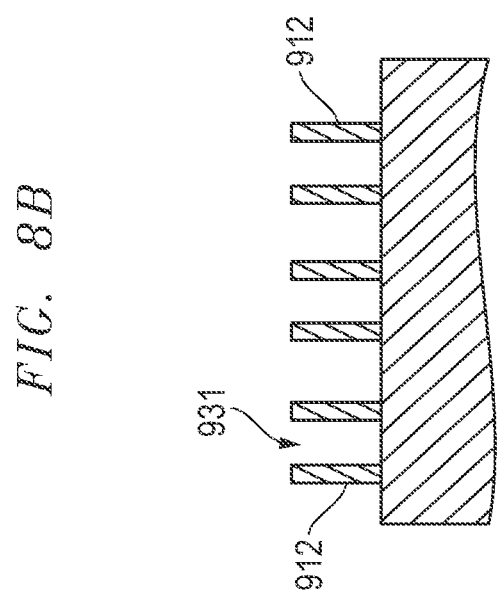

FIGS. 8A-8B illustrate an application of the ALE process techniques disclosed herein in a fin reveal application. As shown in FIG. 8A, a fin 807 on a substrate is protected by a silicon nitride layer 805. Silicon oxide 803 is provided around the fin 807 regions as shown in FIG. 8A. The silicon oxide 803 may be removed (in this example partially removed) in this application via use of the ALE process disclosed herein. In this manner, the silicon oxide 803 may be removed selectively to the silicon nitride layer 805 to achieve a structure such as shown in FIG. 8B.

Figure 9A:
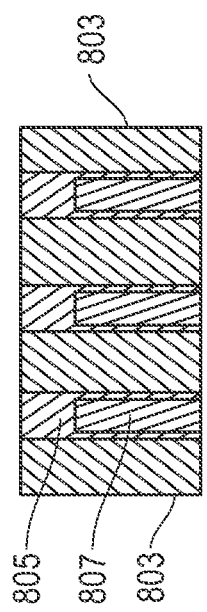
FIGS. 9A-9B illustrate a representative application of the method described herein in an oxide mandrel pull application.
Figure 9B:
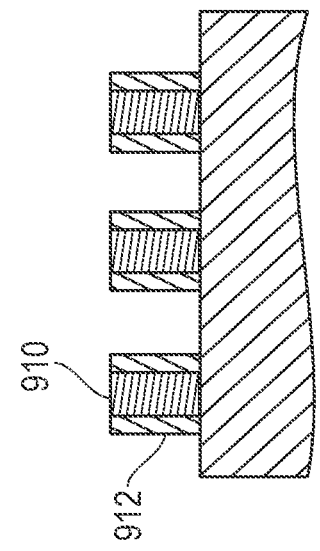

FIGS. 9A-9B illustrates an application of the ALE process techniques disclosed herein in an oxide mandrel pull application. As shown in the figures, a silicon oxide mandrel 910 may be surrounded by silicon or silicon nitride layer 912, such as for example, spacers formed on the sides of the silicon oxide mandrel 910. The ALE process described herein may be utilized to remove (pull) the silicon oxide mandrel 910 from the substrate, leaving the spaces 931 remaining post-etch in FIG. 9B.

Figure 10A:
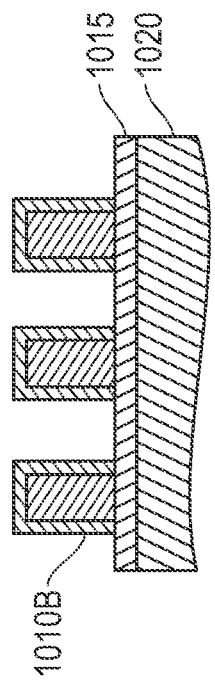
FIGS. 10A-10B illustrate a representative application of the method described herein in a silicon oxide spacer trim application.
Figure 10B:
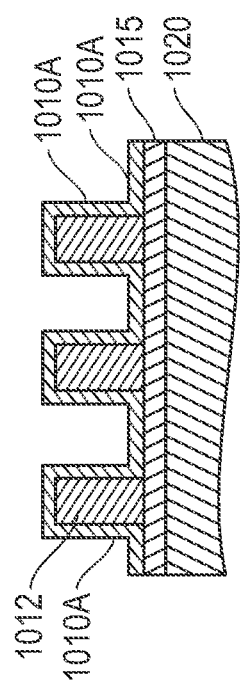

FIGS. 10A-10B illustrate an application of the ALE process techniques disclosed herein in a silicon oxide spacer trim application. As shown in the FIG. 10A, a silicon oxide spacer 1010A may be formed around a structure 1012 (for example a silicon or silicon nitride structure). The silicon oxide spacer 1010 may also be provided over an etch stop layer 1015. The ALE process described herein may be utilized to provide a spacer trimming step to trim a portion of the silicon oxide spacer 1010A in a controlled manner so as to narrow the silicon oxide spacer 1010A width to produce a narrower silicon oxide spacer 1010B as shown in the FIG. 10B.

Figure 11A:
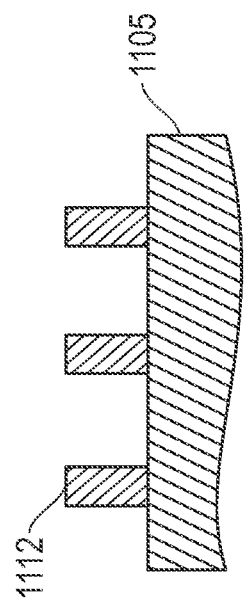
FIGS. 11A-11B illustrates a representative application of the method described herein in a silicon oxide liner etch application.
Figure 11B:
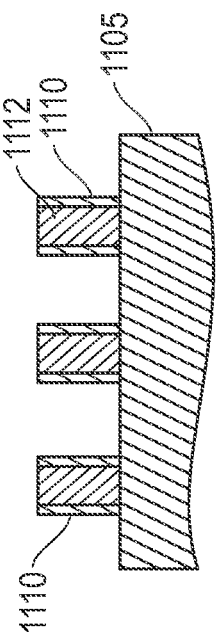

FIG. 11 illustrates an application of the ALE process techniques disclosed herein in a silicon oxide liner etch application. As shown in the figure, a silicon oxide liner 1110 may line the sides of a structure 1112 (for example a silicon or silicon nitride structure) as shown in FIG. 11A. The silicon oxide liner 1110 may then be removed via oxide liner etch 1122 in a manner selective to the structure 1112 to produce a structure as shown in the FIG. 11B by utilizing the ALE process disclosed herein as an oxide liner etch.

Figure 12:
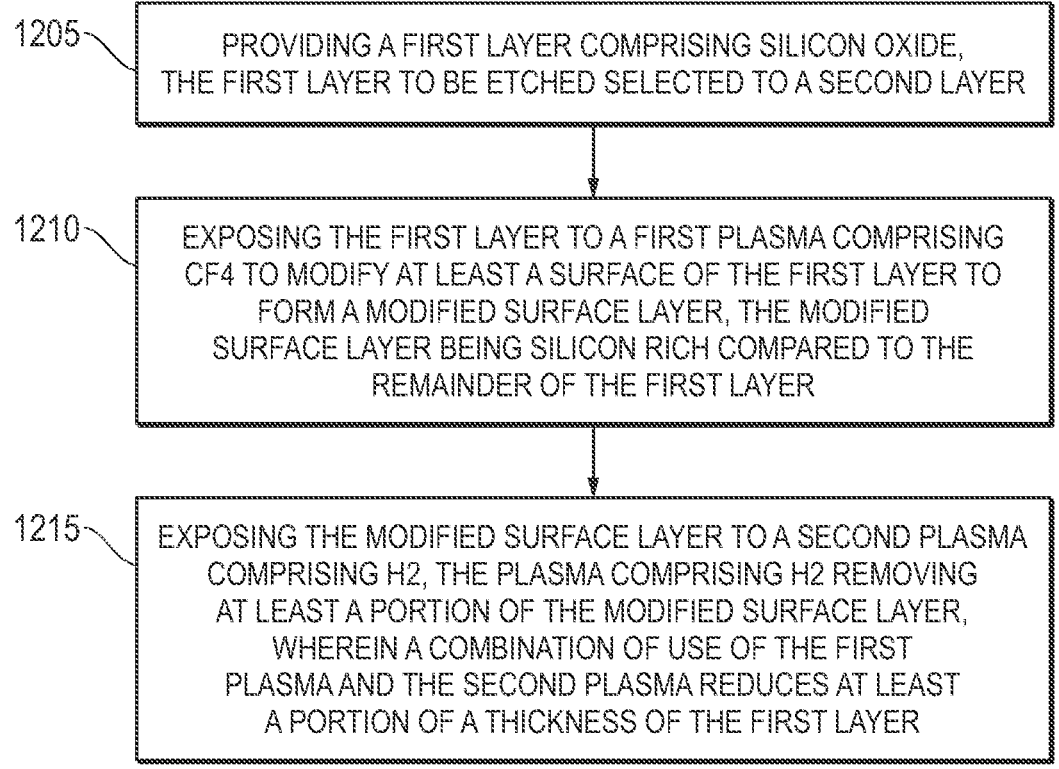
FIGS. 12-14 illustrate a representative flow diagrams of the methods disclosed herein.
Figure 13:
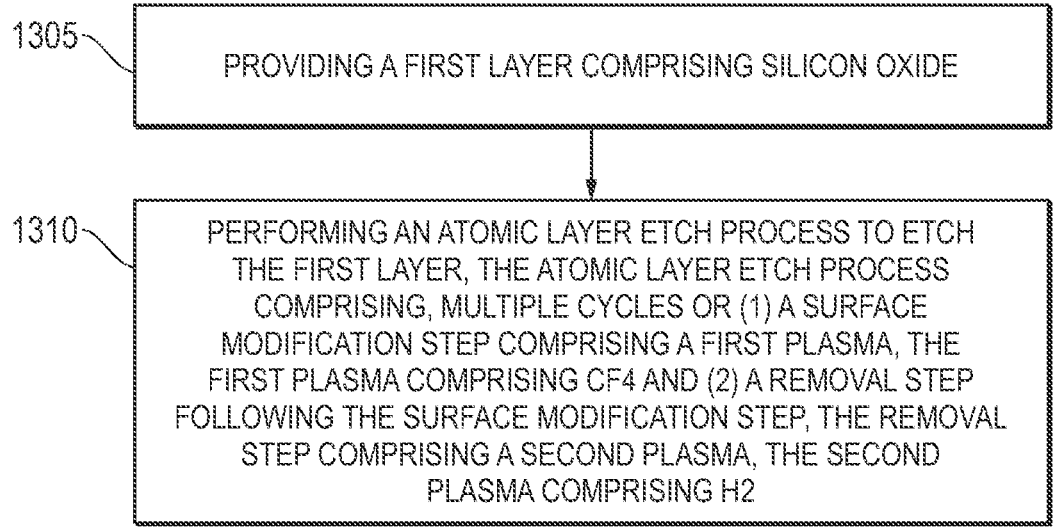
Figure 14:
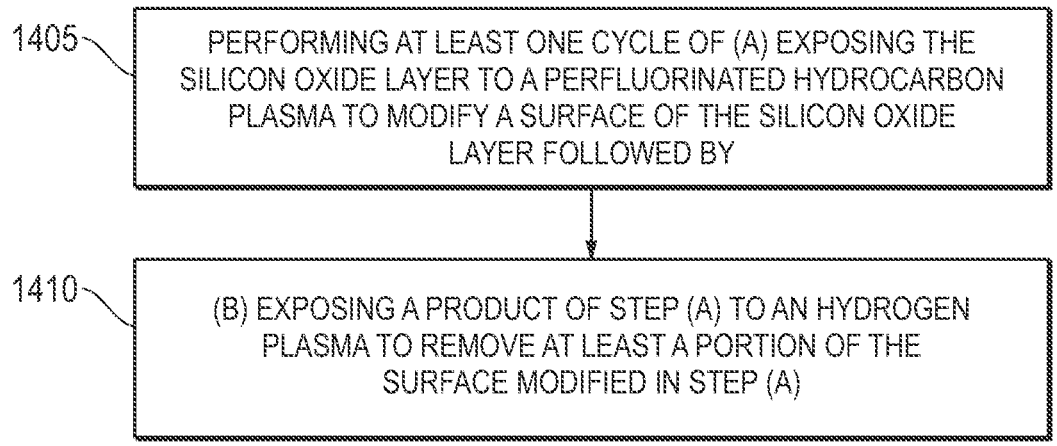

It will be recognized that the process flows described above are merely exemplary, and many other processes and applications may advantageously utilize the techniques disclosed herein. FIGS. 12-14 illustrate exemplary methods for use of the processing techniques described herein. It will be recognized that the embodiments of FIGS. 12-14 are merely exemplary and additional methods may utilize the techniques described herein. Further, additional processing steps may be added to the methods shown in the FIGS. 12-14 as the steps described are not intended to be exclusive. Moreover, the order of the steps is not limited to the order shown in the figures as different orders may occur and/or various steps may be performed in combination or at the same time.

In FIG. 12, a method of etching a substrate is shown. The method includes step 1205 of providing a first layer comprising silicon oxide, the first layer to be etched selective to a second layer. The method further includes step 1210 of exposing the first layer to a first plasma comprising CF4 to modify at least a surface of the first layer to form a modified surface layer, the modified surface layer being silicon rich compared to the remainder of the first layer. The method further includes step 1215 of exposing the modified surface layer to a second plasma comprising H2, the plasma comprising H2 removing at least a portion of the modified surface layer. In the method, a combination of use of the first plasma and the second plasma reduces at least a portion of a thickness of the first layer.

In FIG. 13, a method for etching a substrate is shown. The method includes step 1305 of providing a first layer comprising silicon oxide. The method further includes step 1310 of performing an atomic layer etch process to etch the first layer. In the method, the atomic layer etch process may include a step of multiple cycles of (1) a surface modification step comprising a first plasma, the first plasma comprising CF4 and (2) a removal step following the surface modification step, the removal step comprising a second plasma, the second plasma comprising H2.

In FIG. 14, a method for reducing a thickness of a silicon oxide layer on a substrate is shown. The method includes step 1405 of performing at least one cycle of (a) exposing the silicon oxide layer to a perfluorinated hydrocarbon plasma to modify a surface of the silicon oxide layer. Step 1405 is followed by step 1410 of (b) exposing a product of step (a) to an elemental hydrogen plasma to remove at least a portion of the surface modified in step (a).

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method for etching a substrate, comprising:
   receiving the substrate into a plasma processing chamber, the substrate comprising a silicon-containing film;
   exposing the substrate to a first plasma comprising carbon tetrafluoride (CF4) to form a silicon enriched layer on the silicon-containing film; and
   exposing the substrate to a second plasma comprising hydrogen (H2) to remove the silicon enriched layer on the silicon-containing film,
   wherein a combination of use of the first plasma and the second plasma reduces at least a portion of a thickness of the silicon-containing film.

2. The method of claim 1, wherein the first plasma modifies at least a surface of the substrate to form a modified surface layer, the modified surface layer being silicon rich compared to a remainder of the substrate, and wherein the second plasma removes at least a portion of the modified surface layer.

3. The method of claim 1, wherein the method for etching the substrate is part of a self-aligned contact application.

4. The method of claim 1, wherein the method for etching the substrate is part of a fin reveal application.

5. The method of claim 1, wherein the method for etching the substrate is part of an oxide mandrel pull application.

6. The method of claim 1, wherein the method for etching the substrate is part of a silicon oxide spacer trim application.

7. The method of claim 1, wherein the method for etching the substrate is part of a silicon oxide liner etch application.

8. The method of claim 1, wherein the silicon containing film comprises silicon oxide, silicon oxynitride, and/or polysilicon.

9. A method for etching a substrate, comprising:
   receiving the substrate into a plasma processing chamber, the substrate comprising a film layer on a surface of the substrate;
   exposing the silicon-containing film layer to a first plasma comprising carbon tetrafluoride (CF4) to form a metal hydride layer on the film layer or a silicon enriched layer on the film layer; and
   exposing the silicon-containing film layer to a second plasma comprising hydrogen (H2) to remove the metal hydride layer or the silicon enriched layer,
   alternating between the exposing the first plasma and the second plasma to the substrate to reduce at least a portion of a thickness of the substrate.

* * * * *